United States Patent [19]
Holcomb

[11] Patent Number: 4,862,578
[45] Date of Patent: Sep. 5, 1989

[54] TUBE MAGAZINE COMPONENT FEEDER

[76] Inventor: Gregory W. Holcomb, 13 Viento, Irvine, Calif. 92714

[21] Appl. No.: 87,412

[22] Filed: Aug. 20, 1987

[51] Int. Cl.⁴ .................. B23Q 7/10; G07F 11/38; B65B 35/00
[52] U.S. Cl. .................................. 29/564.1; 29/714; 221/80; 221/87; 221/242; 414/417; 414/798.2; 414/900
[58] Field of Search ............... 221/80, 87, 88, 242; 226/95, 112; 227/127, 43, 139; 29/834, 714, 564.1, 741; 414/104, 32, 403, 404, 413, 417, 900, 798.2; 406/88; 269/45, 71, 73, 76

[56] References Cited
U.S. PATENT DOCUMENTS

| | | |
|---|---|---|
| 3,645,581 | 2/1972 | Lasch, Jr. et al. .................. 221/88 |
| 4,293,998 | 10/1981 | Kawa et al. .......................... 29/741 |
| 4,355,938 | 10/1982 | Page .................................. 221/242 |
| 4,539,740 | 9/1985 | Scrantom et al. .................. 29/564.1 |
| 4,558,514 | 12/1985 | Scrantom ........................... 29/564.1 |

Primary Examiner—Bruce Y. Arnold
Assistant Examiner—R. D. Shafer
Attorney, Agent, or Firm—Roberts and Quiogue

[57] ABSTRACT

A tube magazine component feeder is disclosed. The component feeder is reconfigurable to accommodate different tube magazine sizes and different component configurations. The component feeder includes a pair of upright masts for supporting loaded tube magazines in a stacked upright manner. The spatial separation of the two masts is adjustable to accommodate different tube magazine lengths. Other elements of the component feeder are adjustable or replaceable so as to quickly and easily adapt the device to a different tube magazine size or different component configuration.

12 Claims, 4 Drawing Sheets

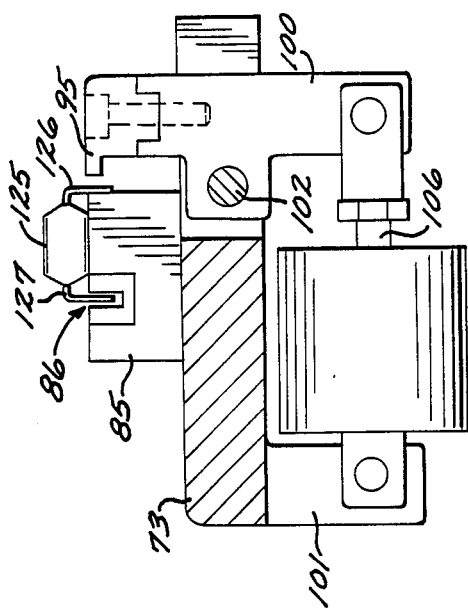
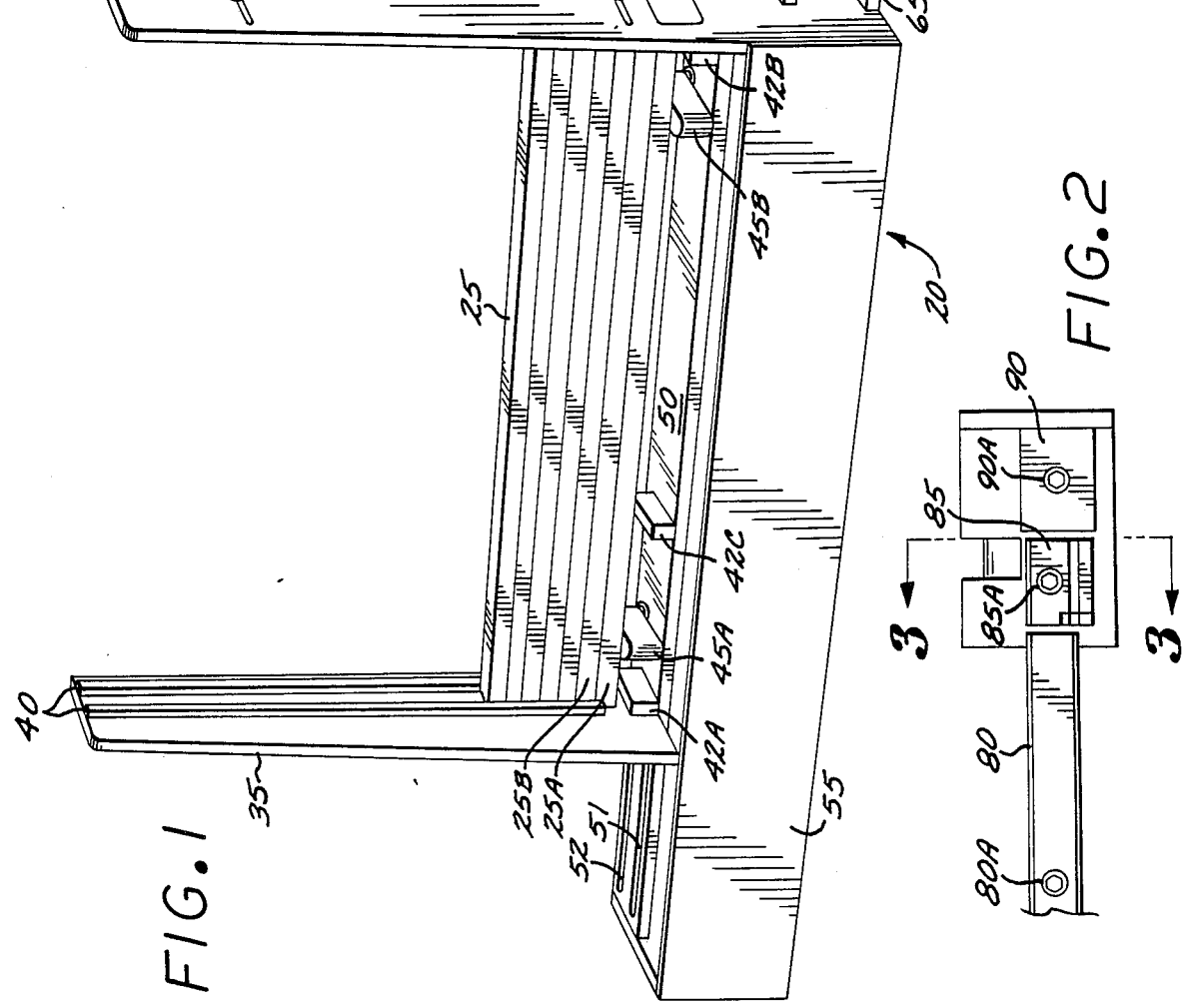

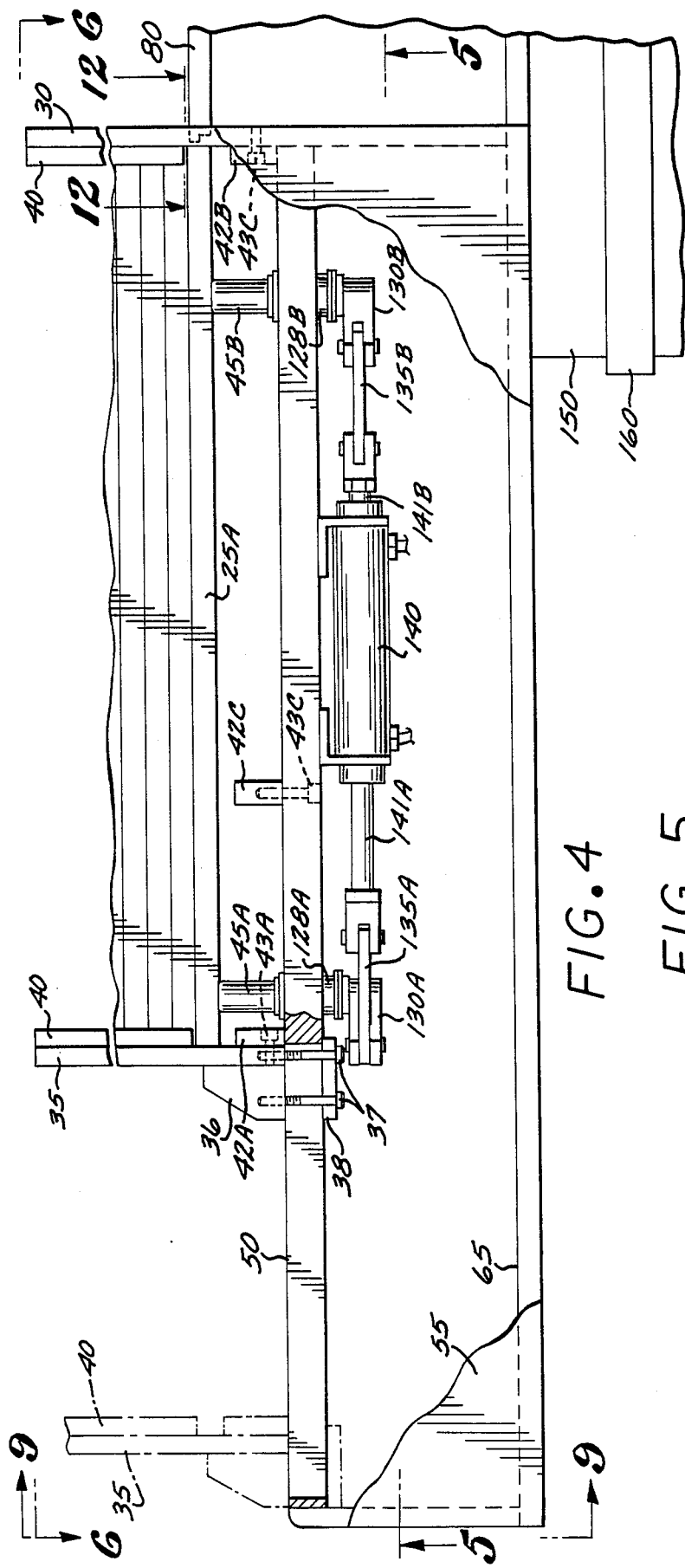
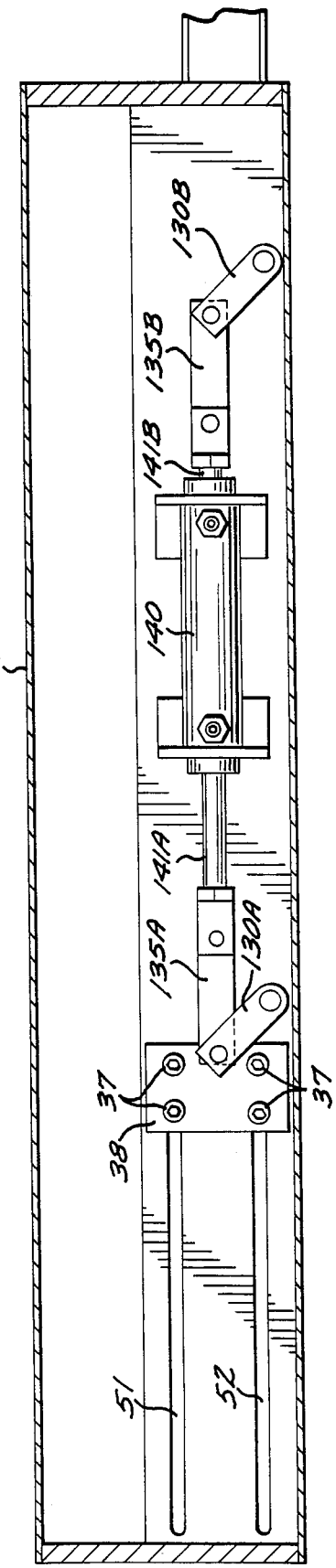
FIG. 4
FIG. 5

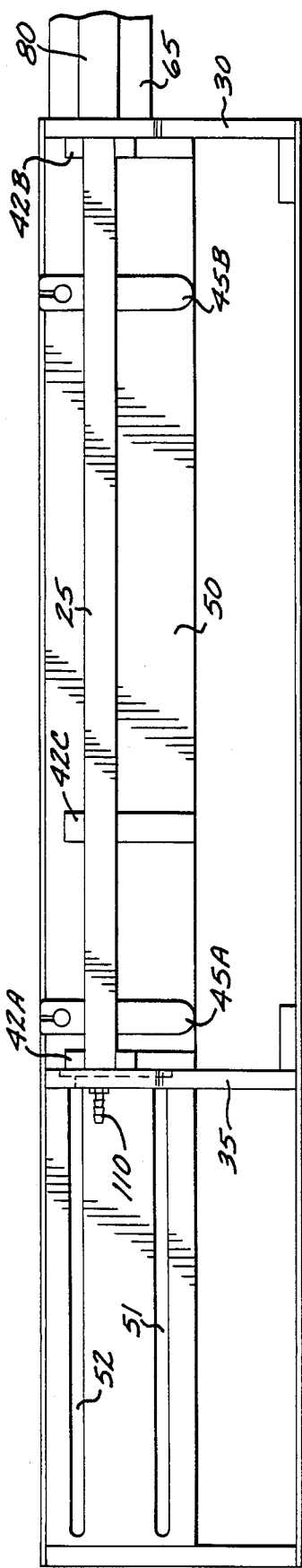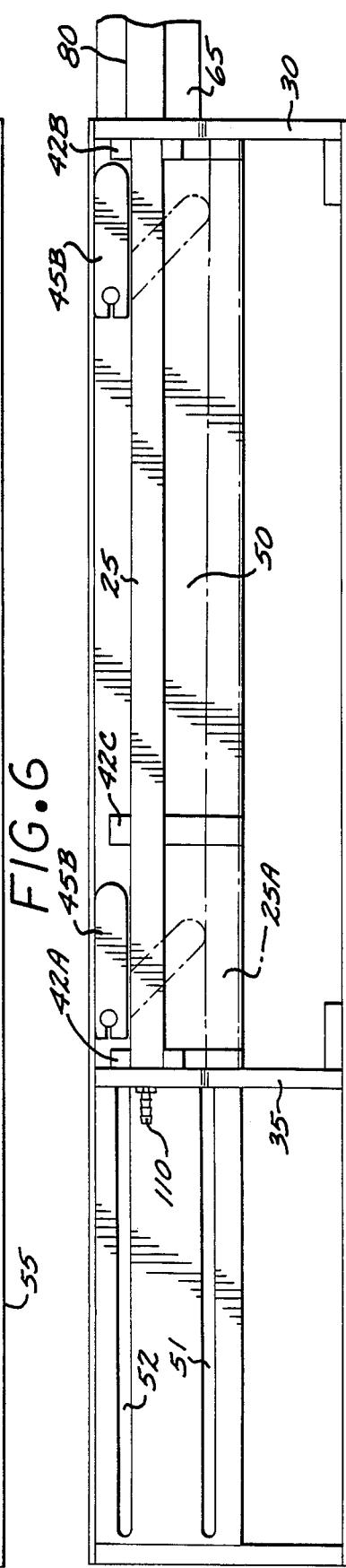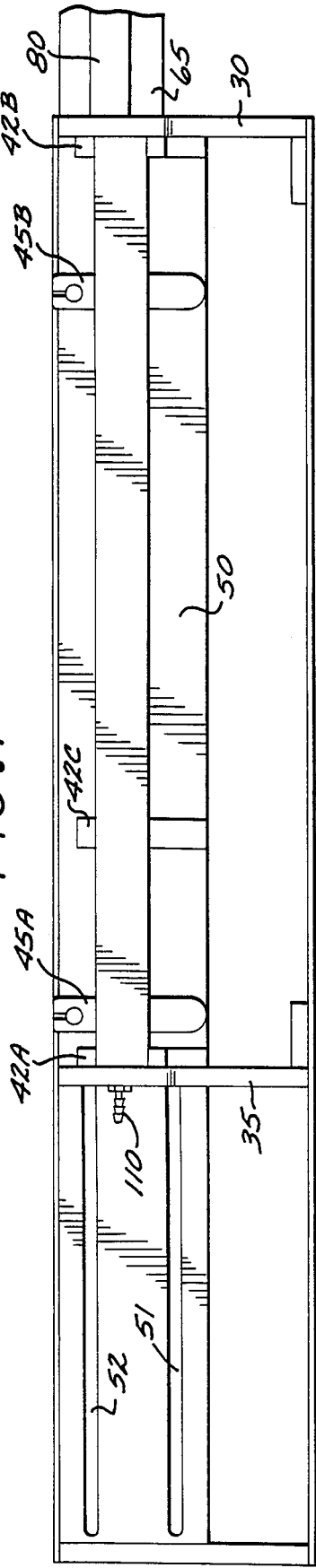

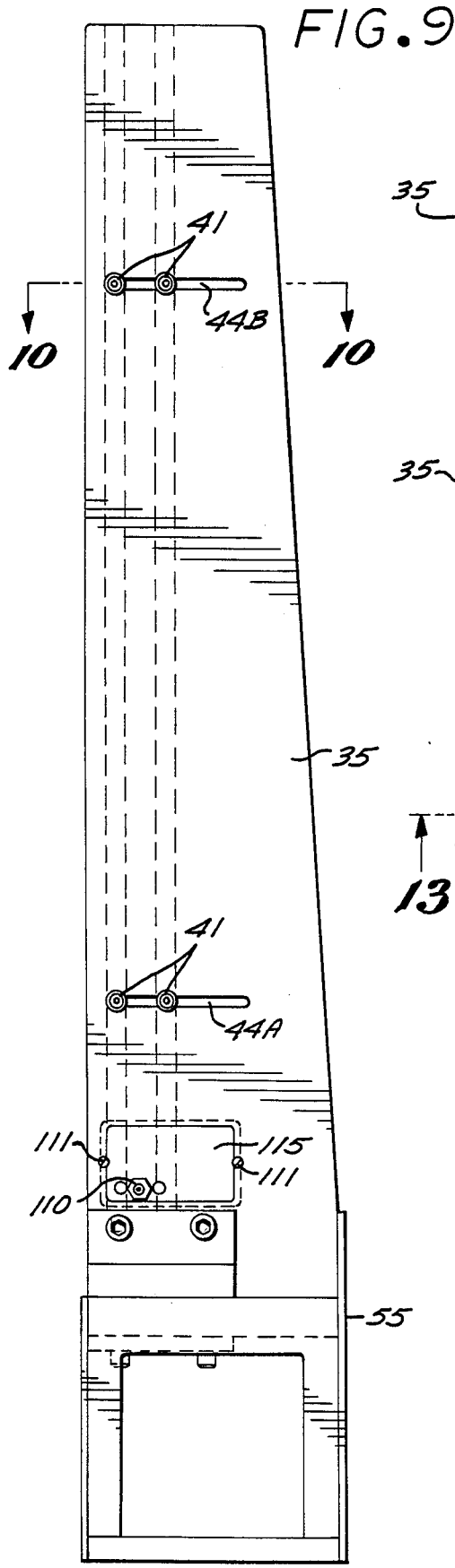
FIG. 9
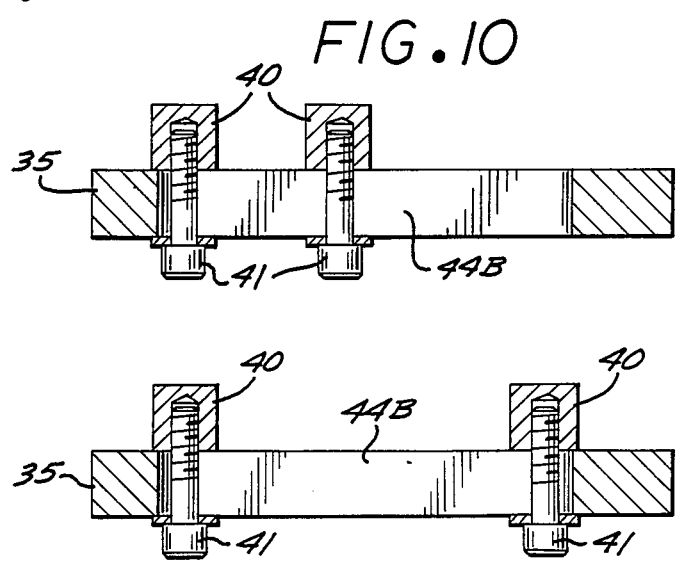
FIG. 10
FIG. 11
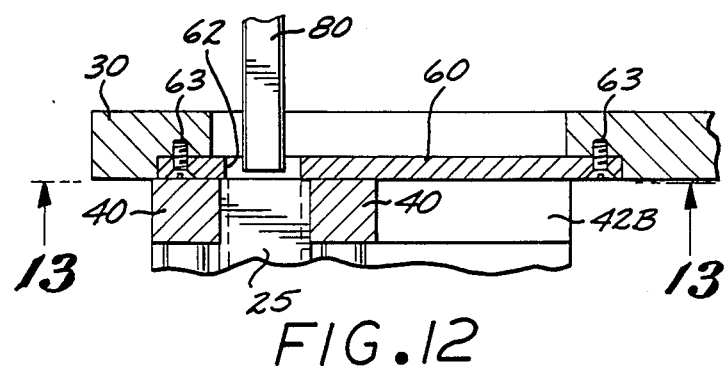
FIG. 12
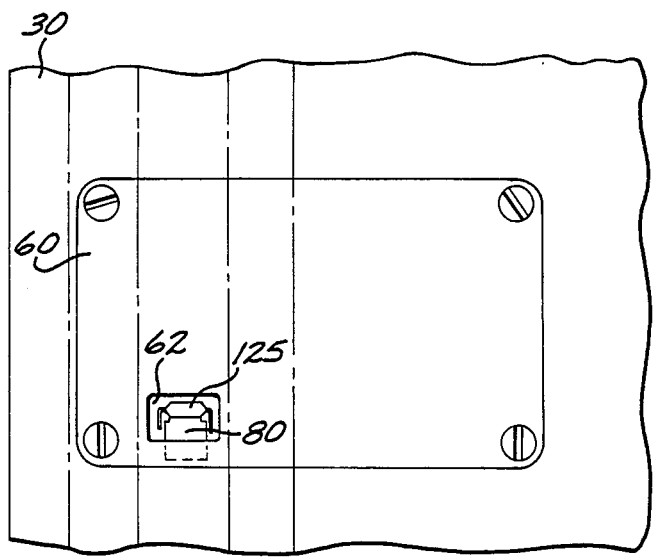
FIG. 13

4,862,578

TUBE MAGAZINE COMPONENT FEEDER

BACKGROUND OF THE INVENTION

The present invention relates to the field of robotic insertion systems for the insertion of electrical components into circuit boards, and more particularly to an improved tube magazine feeder capable of adapting to a variety of tube magazine sizes.

Robotic systems are commonly used to insert electrical components into circuit boards. These systems automate the process of "stuffing" boards with electrical components. Typically a system will include a robot which picks a component up at a pickup station and then inserts it at a predetermined location in a circuit board.

Many types of electrical components are delivered by the component manufacturer to the board fabricator in tube magazines. For example, tube magazines are commonly used to store and ship dual inline package (DIP) components. The components are removed from the tube magazines prior to pick up by the robot.

There are available on the market today tube magazine feeder devices which hold a plurality of tube magazine in a stacked relationship, and unload the components in the lowermost tube onto a component track for delivery to the pickup station. After a tube is emptied, it is ejected from the feeder device and the next loaded magazine drops into the unloading position.

One disadvantage of these known feeder devices is that they are constructed to receive only one size of tube magazine, i.e., the device handles only one particular type of electrical component. This severely limits the utility of the device, since if the need arises to insert a different type of component stored in a different sized tube magazine, one must replace the entire feeder unit with a different tube magazine feeder. Such a solution to this problem is capital and space intensive, and moreover tends to limit the usefulness of the component insertion system or line.

It is therefore a principle object of the invention to provide a tube magazine feeder which may be adapted to handle a variety of component and tube magazine sizes.

SUMMARY OF THE INVENTION

A tube magazine component feeder is disclosed which is adaptable to tube magazines of different sizes. A plurality of loaded tube magazines are held in vertically stacked arrangement by a pair of upright masts, each having a pair of aligned tube guide rails.

In accordance with the invention, means are provided to adjust the spatial separation between the two masts to accommodate various tube magazine lengths, and to adjust the spacing of the guide rails to accommodate various tube magazine widths.

The feeder device further includes a component track onto which components are expelled from the lowermost tube magazine. The track extends between an exposed end of the lowermost tube magazine and a component pickup station.

In accordance with the invention, means are provided for readily changing elements of the device to adapt the component feeder to different tube magazine and/or component configurations.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 1 is a side perspective view illustrative of a tube magazine component feeder embodying the present invention.

FIG. 2 is a partial top view along line 2—2 of FIG. 1, showing the component pickup station.

FIG. 3 is a cross-sectional view taken through line 3—3 of FIG. 2.

FIG. 4 is a partially broken-away side view of the component feeder shown in FIG. 1.

FIG. 5 is a cross-sectional view taken along line 5—5 shown in FIG. 4.

FIG. 6 is a cross-sectional view taken along line 6—6 of FIG. 4.

FIG. 7 and FIG. 8 are cross-sectional view similar to FIG. 6 except showing the tube ejection flippers in different respective positions.

FIG. 9 is an end view of the tube magazine compliment feeder shown in FIG. 1.

FIG. 10 is a cross-sectional view taken along line 10—10 of FIG. 9.

FIG. 11 is a cross-sectional view similar to FIG. 10 except showing the tube magazine guide rails in a spaced apart relationship.

FIG. 12 is a partial cross-sectional view taken along line 12—12 of FIG. 4.

FIG. 13 is a partial cross-sectional view taken along lines 13—13 shown in FIG. 12.

DETAILED DESCRIPTION OF THE DISCLOSURE

Tube magazine component feeders in accordance with the present invention are intended to be utilized with robotic component insertion systems. One exemplary system is described in applicant's co-pending application Ser. No. 734,964, entitled "Circuit Assembly System," the entire disclosure of which is incorporated herein by this reference.

Referring now to FIG. 1, a tube magazine component feeder 20 embodying the invention is disclosed in side perspective view. The feeder 20 receives a plurality of component tube magazines 25 arranged in stacked relationship and sequentially feeds the components stored within the lowermost magazine 25A to a component pick-up station. When the lowermost magazine 25A has been emptied, the spent magazine is ejected, and the next lowest magazine 25B drops down to be emptied next.

The device 20 comprises a pair of upright masts 30 and 35. The position of the mast 30 is fixed in relation to the top plate 50. The position of the mast 35 is adjustable along the extent of a pair of slots 51, 52 formed in the top plate 50.

Each mast 30, 35 further comprises a pair of tube magazine guide rails 40 to guide and support the positions of the tube magazines 25 in a stacked, aligned configuration.

As will be described more fully below, means are provided for adjusting and securing the position of the mast 35 along the extent of the slots 51, 52 in top plate 50 so as to accommodate tube magazines of different lengths, and also to adjust the spacing of the guide rails 40 to accommodate tube magazines of different widths.

The lowermost tube magazine 25A stored in the feeder device 20 rests on the upper surfaces of the spaced tube ejection flippers 45A, 45B. A stream of air is forced through the tube magazine from an air nozzle 110 (FIGS. 6–8) fixed in the plate 115 (FIG. 9) in the mast 35, the air stream flowing toward the mast 30 so as to expel the components stored within the magazine onto the component track 80.

The track 80 is secured to the top surface 76 of an inline vibratory feeder device 75 and extends to the end-of-track tooling member 85 at the component pickup station. With the vibrating action supplied to track 80 by the vibratory device 75 and the expelling force of the air stream, the components are urged along the track 80 toward the pick-up station indicated generally by reference 82 at the end-of-track tooling member 85.

The track 80 is removably secured to feeder device 75 by threaded fasteners to allow the track to be readily replaced to adapt the feeder 20 to components of different sizes. Thus, for one particular component, a first track having particular height and width dimensions will be appropriate, while for another component, say one that is wider than the first, a second track having a larger width dimension will be needed.

The inline feeder device 75 is of a type which is commercially available, such as the IN0600 model feeder marketed by California Vibratory Feeders, Incorporated. The use of vibratory feeders for this purpose is per se well known. The vibratory feeder 75 is secured on the inline support plate 70, which is supported between the upright mast 30 and plate 71. The subplate 65 forms the base of the device 20 and supports upright end support plate 72. The plate 73 supports the end-of-track tooling block 85, the component stop-and-end-sensor block 90, as well as lead clamp jaw 95, clevis 100 and pneumatic cylinder 105 as will be described more fully below.

FIG. 2 is a top view illustrating the pick-up station 82 defined by the tooling block 85, and also shows the component track 80 and the sensor block 90. Just as the component track 80 is replaceable to accommodate components of different sizes, so are the end-of-tooling block 85, the stop block 90 and the lead clamp jaw 95. Thus, blocks 85 and 90 of different heights and widths and jaws 95 of different sizes are employed to accommodate components of different sizes. Fastener means 85A and 90A are employed to removably secure the blocks 85 and 90 to support plate 73. A fastener is also used to removably secure the jaw 95 to clevis member 100.

FIG. 3 is a cross-sectional view taken along line 3—3 of FIG. 2 to illustrate the component lead clamping mechanism employed by the feeder device 20 at the pickup station 82. The lead clamping mechanism comprises a pneumatic cylinder 105 having an extendible piston 106 which is coupled to a clevis 100, pivoting about clevis pin 102. The pneumatic cylinder 105 is supported by the clevis 100 on the one end and a fixed support bracket 101 depending from the support plate 73 on its other end. Therefore, by extending or retracting the piston 106 upon command from the robot system controller (not shown), the lead clamping jaw 95 is selectively placed in the open position as shown in FIG. 3 or in a clamping position to clamp the depending lead 126 of the component 125 at the component pickup station.

The lead clamping mechanism is employed to secure the component 125 in position at the pickup station while the component is gripped by the insertion robot (not shown). After the robot grips the component, the pneumatic cylinder 105 is relaxed, withdrawing piston 106 and retracting the gripping jaw 95 to the open position. With the lead 126 released by the lead clamping mechanism, the robot may remove the component 125 for further operations, such as insertion in a circuit board.

FIG. 3 also shows the end-of-track tooling block 85 in further detail. The block 85 shown here includes a groove 86 through which one lead 127 of the component 125 fits. As the width space between the leads 126 and 127 of the component 125 increase or decrease, the corresponding dimensions of the block 85 are changes, by replacing one block 85 with another block 85 having appropriate dimensions.

Referring now to FIG. 4, a partially broken-away side view of the tube magazine component feeder 20 is shown. In this view, the adjustability of the mast 35, as well as the mechanism for manipulating the positions of the tube ejection flippers 45A and 45B are disclosed in further detail. Each flipper 45A, 45B is supported on a corresponding axle 128A or 128B which extends through corresponding bores formed in the top plate 50. Thus, the flippers 45A and 45B are mounted on the axles 128A and 128B protruding through the upper surface of the top plate 50. On the underside of the top plate 50, bell cranks 130A and 130B are in turn mounted on the protruding ends of the respective axles 128A and 128B. Each bell crank 130A, 130B is in turn connected to a respective piston 141A or 141B of the double rod air cylinder assembly 140 by corresponding link members 135A or 135B.

The pistons of the double rod air cylinder 140 operate in tandem such that as one cylinder piston is fully extended, the other piston is fully retracted. Thus, the flipper members 45A and 45B are also operated in tandem such that they are disposed in parallel throughout their ranges of movement.

Referring to FIGS. 4 and 5, a means for adjustably securing the adjustable mast 35 along the slots 51, 52 is shown. The mast foot member 36 is fastened to the mast 35 to support the mast in the upright position. A lower plate 38 is employed with threaded fasteners 37, received in corresponding threaded bores in mast 35 and foot members 36, to adjustably secure the position of the mast 35. By loosening the threaded fasteners 37, the position of the mast 35 may be adjusted along the extent of the longitudinal slots 51, 52 formed in the top plate 50. Tightening the fasteners 37 secures the mast 35 in place. This feature is provided to allow the feeder device 20 to adjust to various tube lengths.

Referring now to FIGS. 6–8, these figures are taken along section line 6—6 of FIG. 4, showing partial top views of the apparatus with the tube ejection flipper members 45A and 45B at several positions within their ejection cycle. In FIG. 6 the ejection flippers 45A and 45B are disposed at right angles to the lowermost magazine tube and support the tube thereon. Once the tube is emptied, a condition which is detected by a sensor (not shown), the air cylinder 140 is actuated to direct the flippers to a substantially parallel disposition relative to the tube magazine (FIG. 7). This allows the entire stack of tubes to drop downwardly onto the tube support blocks 42A and 42B. Thereupon, as shown in FIG. 8, the flippers 45A and 45B are then returned to their substantially orthogonal disposition relative to the tube magazines. As this return to position occurs, the flippers 45A and 45B strike the lowermost tube 25, which has dropped downwardly onto the support blocks 42A, 42B and 42C eject it away from the aligned position of the remaining tube magazines in the stack. The remaining tube magazines then drop downwardly one position such that a fully loaded tube 25B is now the lowermost tube resting on the ejection flippers 45A, 45B, and may now be unloaded onto the vibrating track 80. Th ejection cycle is repeated as the magazines are emptied.

The support blocks 42A, 42B and 42C are secured to the top plate 50 by threaded fasteners. These blocks are replaceable to adapt the feeder 20 to tube magazines of different heights. Preferably, for example, in this embodiment, the top surface of the support blocks 42A and 42B and 42C is about 0.030 inches below the lower surface of the tube magazines 25A as it rests on the tube ejection flippers 45A, 45B.

Referring now to FIG. 9, an end view of the component feeder 20 is shown. The slots 44A and 44B formed in the mast 35 are visible in this view. These slots provide adjustability in the positioning of the tube guide rails 40. By loosening the threaded fasteners 41, the user may slide the guide rails 40 to the desired position along the extent of the slots 44A and 44B to accommodate a particular tube width. Similar slots and fasteners are provided with respect to the mast 30, as generally indicated in FIG. 1.

The positioning of the guide rails 40 is further disclosed in the cross-sectional views of FIGS. 10 and 11. In FIG. 10 the guide rails 40 are depicted in a relatively closely spaced configuration. However, in FIG. 11 the guide rails are spaced further apart to accommodate a wide tube.

So as to accommodate the adjustability in the positioning of the guide rails 40, a removeable rear plate 115 is secured to the aperture plate opening formed in the mast 35 by fasteners 111. The plate 115 carries the air nozzle 110, which is connected by an air line (not shown) to a source of pressurized air (not shown). Depending upon the particular positioning employed for the guide rails 40, the air nozzle 110 will need to be positioned appropriately to be aligned with the tube magazine 25A. By fabricating a plurality of aperture plates 110, each having the nozzle 110 located in a different position, the air nozzle 110 may be aligned with the center of the tube as desired for a particular tube width.

Referring now to FIG. 12, this is a cross-sectional view taken along line 12—12 of FIG. 4, and depicts the front aperture plate 60, fitted into an aperture plate opening formed in the fixed mast 30. The front aperture plate 60 is provided with a aperture 62 through which the components 125 loaded in the lowermost tube magazine 25 are expelled onto the track 80 by the air stream. The aperture plate 60 is removable to effect a tooling change so as to accommodate different tube magazine cross-sectional dimensions. It is necessary that the aperture 62 be aligned with the tube magazine 25A with an opening configuration which allows the components 125 to be sequentially expelled therethrough, without permitting the tube magazine 25A to be expelled through the aperture 62. The track 80 extends through the aperture 62 to the adjacent open end of the tube magazine 25A, as shown in FIG. 12. Thus, by utilizing a plurality of different aperture plates 60, each with the aperture 62 located in a correspondingly different position, the feeder 20 may be adapted to accommodate different tube sizes and component configurations.

FIG. 13 is a cross-sectional view taken along line 13—13 of FIG. 12 and further illustrates the front aperture plate 60 and the corresponding aperture 62 with a component 125 located on the track 80.

A tube magazine component feeder has been disclosed which is readily adaptable to tube magazines of different sizes and to different component configurations. The feeder 20 comprises means for adjusting the spatial separation of the upright masts and the tube guide rails, respectively. The device further comprises change tooling to allow the track 80, end-of-track block 85, stop block 90, the tube support blocks 42A and 42B, and the plates 60 and 115 to be replaced readily, so as to adapt the device to different tube magazine and/or component configurations.

It is understood that the above-described embodiment is merely illustrative of the possible specific embodiments which represent principles of the present invention. Other arrangements may readily be devised in accordance with these principles by those skilled in the art without departing from the scope of the invention.

What is claimed is:

1. An adjustable tube magazine component feeder for feeding electrical components to a robotic component insertion system, adaptable to handle tube magazines of different sizes, comprising:

first and second upright mast members disposed in a spaced arrangement for receiving therebetween a a plurality of tube magazines;

a top plate member having at least one elongated slot formed therein;

a mast foot member secured at the base of said second mast member for supporting the upright position of said second mast member, thereby forming a mast and foot assembly;

means for guiding and supporting said plurality of tube magazines in a stacked, aligned relationship, said means being adjustable to accommodate tube magazines of different widths;

means for adjusting the spatial separation between said first and second mast members in dependence on the particular length of said tube magazines, said means comprising means for selectively fixing the position of said second mast member along the extent of said elongated slot, comprising a fastener means extending through said slot in said top plate for securing the position of said mast at desired position when tightened, and for allowing the mast to be moved along the extent of said slot when loosened;

said first mast member having an aperture formed therein in alignment with the lowermost one of said tube magazines;

a component track member extending through said aperture in said first mast member to adjacent an open end of said lowermost one of said tube magazines and to a component pickup station;

means for sequentially expelling components stored in said lowermost one of said tube magazines onto said component track member;

means for urging components along said track member to said component pickup station; and means for ejecting the lowermost one of said tube magazine when emptied of components and disposing a fresh magazine in position to be emptied of components by said urging means.

2. The feeder of claim 1 further comprising a fastener plate disposed adjacent the lower surface of said top plate, and said fastener means comprises a threaded fastening device extending through an opening formed in said fastener plate and said slot, and received into a corresponding threaded bore formed in said second mast and foot assembly, wherein said second mast may be moved along the extent of said slot when said fastening device is loosened, and said threaded fastening device may be tightened within said threaded bore to draw said fastener plate and said mast and foot assembly tightly adjacent said top plate to fix the position of said second mast in relation to said top plate.

3. The feeder of claim 1, wherein said means for sequentially expelling components stored in said lowermost one of said tube magazines comprises:
   a first aperture plate member received in said first mast member and having a first component aperture disposed therein in alignment with said lowermost tube;
   a second plate received in said second mast member and having an air nozzle fitted therein in alignment with said lowermost tube; and
   means for forcing pressurized air through said nozzle to cause a stream of air to move through said tube magazine to urge said components out of said magazine onto said track.

4. An adjustable tube magazine component feeder for feeding electrical components to a robotic component insertion system, adaptable to handle tube magazines of different sizes, comprising:
   first and second upright mast members disposed in a spaced arrangement for receiving therebetween a a plurality of tube magazines;
   means for guiding and supporting said plurality of tube magazines in a stacked, aligned relationship, said means being adjustable to accommodate tube magazines of different widths;
   means for adjusting the spatial separation between said first and second mast members in dependence on the particular length of said tube magazines;
   said first mast member having an aperture formed therein in alignment with the lowermost one of said tube magazines;
   a component track member extending through said aperture in said first mast member to adjacent an open end of said lowermost one of said tube magazines and to a component pickup station;
   means for replacing said track member with another track member of different height or width dimensions to accommodate different component configurations, to adapt the component feeder to different component sizes and configurations;
   means for sequentially expelling components stored in said lowermost one of said tube magazines onto said component track member;
   means for urging components along said track member to said component pickup station; and
   means for ejecting the lowermost one of said tube magazines when emptied of components and disposing a fresh magazine in position to be emptied of components by said urging means.

5. The feeder of claim 4 further comprising an end-of-track tooling member disposed at said component pickup station for receiving said components from said track, and means for replacing said tooling member with another tooling element to accommodate different component sizes, said tooling element having height and width dimensions corresponding to the dimensions of said track member.

6. The feeder of claim 5 further comprising a means for clamping at least one lead of such electrical component at said tooling elements, said means comprising a jaw member which is moveable between an open position and a closed position relative to said tooling element to selectively release or clamp said lead.

7. The feeder of claim 4 wherein said means for expelling components stored in said lowermost one of said tube magazines comprises means for forcing a stream of pressurized air into said lowermost tube magazine to urge said components out of said magazine onto said track.

8. An adjustable tube magazine component feeder for feeding electrical components to a robotic component insertion system, adaptable to handle tube magazines of different sizes, comprising,
   first and second upright mast members disposed in a spaced arrangement for receiving therebetween a a plurality of tube magazines;
   means for guiding and supporting said plurality of tube magazines in a stacked, aligned relationship, said means being adjustable to accommodate tube magazines of different widths;
   means for adjusting the spatial separation between said first and second mast members in dependence on the particular length of said tube magazines;
   said first mast member having an aperture formed therein in alignment with the lowermost one of said tube magazines;
   a component track member extending through said aperture in said first mast member to adjacent an open end of said lowermost one of said tube magazines and to a component pickup station;
   means for sequentially expelling components stored in said lowermost one of said tube magazines onto said component track member, said means comprising:
      a first aperture plate member received in said first mast member and having a first component aperture disposed therein in alignment with said lowermost tube;
      a second plate received in said second mast member and having an air nozzle fitted therein in alignment with said lowermost tube; and
      means for forcing pressurized air through said nozzle to cause a stream of air to move through said tube magazine to urge said components out of said magazine onto said track;
   means for replacing said first and second plate members with other respective plate members having said component aperture and said air nozzle disposed appropriately in alignment with different tube magazines to accommodate other component sizes and configurations;
   means for urging components along said track member to said component pickup station; and
   means for ejecting the lowermost one of said tube magazines when emptied of components and disposing a fresh magazine in position to be emptied of components by said urging means.

9. An adjustable tube magazine component feeder for feeding electrical components to a robotic component insertion system, adaptable to handle tube magazines of different sizes, comprising, first and second upright mast members disposed in a spaced arrangement for receiving therebetween a a plurality of tube magazines;

means for guiding and supporting said plurality of tube magazines in a stacked, aligned relationship, said means being adjustable to accommodate tube magazines of different widths;

means for adjusting the spatial separation between said first and second mast members in dependence on the particular length of said tube magazines;

said first mast member having an aperture formed therein in alignment with the lowermost one of said tube magazines;

a component track member extending through said aperture in said first mast member to adjacent an open end of said lowermost one of said tube magazines and to a component pickup station;

means for sequentially expelling components stored in said lowermost one of said tube magazines onto said component track member;

means for urging components along said track member to said component pickup station, said means comprising a vibratory feeder device and means for securing said track member to said vibratory device;

a removable fastening device for releasably securing said track to said vibratory feeder device to allow said track to be replaced with another track of different height or width dimensions to accommodate different component configurations; and means for ejecting the lowermost one of said tube magazines when emptied of components and disposing a fresh magazine in position to be emptied of components by said urging means.

10. The feeder of claim 9 wherein said means for expelling components stored in said lowermost one of said tube magazines comprises means for forcing a stream of pressurized air into said lowermost tube magazine to urge said components out of said magazine onto said track.

11. An adjustable tube magazine component feeder for feeding electrical components to a robotic component insertion system, adaptable to handle tube magazines of different sizes, comprising, first and second upright mast members disposed in a spaced arrangement for receiving therebetween a a plurality of tube magazines;

means for guiding and supporting said plurality of tube magazines in a stacked, aligned relationship, said means being adjustable to accommodate tube magazines of different widths, and comprising respective pairs of tube rails, one pair for each mast member, and wherein the spatial separation between the rails of each pair is adjustable to accommodate tube magazines of different widths;

means for adjusting the spatial separation between said first and second mast members in dependence on the particular length of said tube magazines;

said first mast member having an aperture formed therein in alignment with the lowermost one of said tube magazines;

a component track member extending through said aperture in said first mast member to adjacent an open end of said lowermost one of said tube magazines and to a component pickup station;

means for sequentially expelling components stored in said lowermost one of said tube magazines onto said component track member;

means for urging components along said track member to said component pickup station; and means for ejecting the lowermost one of said tube magazines when emptied of components and disposing a fresh magazine in position to be emptied of components by said urging means.

12. The feeder of claim 11 wherein said means for expelling components stored in said lowermost one of said tube magazines comprises means for forcing a stream of pressurized air into said lowermost tube magazine to urge said components out of said magazine onto said track.

* * * * *